US011215665B2

United States Patent
Zhu et al.

(10) Patent No.: US 11,215,665 B2
(45) Date of Patent: Jan. 4, 2022

(54) DEBUGGING SOLUTION FOR MULTI-CORE PROCESSORS

(71) Applicant: C-SKY Microsystems Co., Ltd., Zhejiang (CN)

(72) Inventors: Taotao Zhu, Hangzhou (CN); Yubo Guo, Hangzhou (CN)

(73) Assignee: C-SKY Microsystems Co., Ltd., Zhejiang (CN)

( * ) Notice: Subject to any disclaimer, the term of this patent is extended or adjusted under 35 U.S.C. 154(b) by 0 days.

(21) Appl. No.: 16/638,730

(22) PCT Filed: Apr. 26, 2019

(86) PCT No.: PCT/CN2019/084514
§ 371 (c)(1),
(2) Date: Feb. 12, 2020

(87) PCT Pub. No.: WO2019/179531
PCT Pub. Date: Sep. 26, 2019

(65) Prior Publication Data
US 2021/0123973 A1 Apr. 29, 2021

(30) Foreign Application Priority Data
Mar. 21, 2018 (CN) .......................... 201810234766.4

(51) Int. Cl.
*G01R 31/317* (2006.01)
*G06F 1/3203* (2019.01)

(52) U.S. Cl.
CPC . *G01R 31/31705* (2013.01); *G01R 31/31701* (2013.01); *G01R 31/31723* (2013.01); *G06F 1/3203* (2013.01)

(58) Field of Classification Search
None
See application file for complete search history.

(56) References Cited

U.S. PATENT DOCUMENTS

2008/0307193 A1* 12/2008 Machimura ......... G06F 11/2242
712/1
2008/0312900 A1* 12/2008 Akiba ................. G06F 11/3652
703/23

(Continued)

FOREIGN PATENT DOCUMENTS

CN 102073565 A 5/2011
CN 103149529 A 6/2013

(Continued)

OTHER PUBLICATIONS

PCT International Search Report dated Jul. 31, 2019, issued in corresponding International Application No. PCT/US2019/084514 (10 pgs.).

(Continued)

*Primary Examiner* — Guerrier Merant
(74) *Attorney, Agent, or Firm* — Finnegan, Henderson, Farabow, Garrett & Dunner, LLP

(57) ABSTRACT

The present disclosure provides a multi-core processor. The multi-core processor comprises a plurality of cores and a debug circuit, the debug circuit comprising debug circuits in the same number as that of the cores, transmission controllers in the same number as that of the cores, and a master control circuit, each of the debug circuits being connected to one core and one transmission controller, respectively, and all transmission controllers being connected to the master control circuit. Each of the debug circuits is configured to generate a debug event signal and respond to the generated debug event signal or received debug event signals generated by other debug circuits. Each of the transmission controllers is configured to respectively control transmission of the debug event signal between the respectively connected debug circuit and the master control circuit. The master control circuit is configured to forward debug event signals among different transmission controllers. The pres- (Continued)

ent disclosure can realize rapid configuration and control of debug event signal transmission, and at the same time lower power consumption of a debug circuit.

18 Claims, 7 Drawing Sheets

(56) References Cited

U.S. PATENT DOCUMENTS

| | | | |
|---|---|---|---|
| 2012/0210103 A1 | 8/2012 | Liao et al. | |
| 2013/0080748 A1* | 3/2013 | Moyer | G06F 9/30076 |
| | | | 712/227 |
| 2013/0318403 A1* | 11/2013 | Kim | G06F 11/3636 |
| | | | 714/38.1 |
| 2014/0281735 A1 | 9/2014 | Olivarez et al. | |
| 2016/0231376 A1 | 8/2016 | Kris | |
| 2017/0045583 A1* | 2/2017 | Hopkins | G01R 31/31705 |

FOREIGN PATENT DOCUMENTS

| | | |
|---|---|---|
| CN | 103365749 A | 10/2013 |
| CN | 104050066 A | 9/2014 |
| CN | 105740119 A | 7/2016 |
| CN | 108415842 A | 8/2018 |
| WO | WO2019/179531 A9 | 9/2019 |

OTHER PUBLICATIONS

First Chinese Search Report issued in corresponding Chinese Application No. 201810234766.4 dated Feb. 23, 2020 (2 pages).

* cited by examiner

DEBUGGING SOLUTION FOR MULTI-CORE PROCESSORS

CROSS REFERENCE TO RELATED APPLICATION

This disclosure is a national stage filing under 35 U.S.C. 0 371 of International Application No. PCT/CN2019/084514, filed on Apr. 26, 2019, which claims the benefits of priority to Chinese application number 201810234766.4, filed Mar. 21, 2018, both of which are incorporated herein by reference in their entireties.

BACKGROUND

Processor debugging can be classified into intrusive debugging and non-intrusive debugging. The intrusive debugging stops a data processor from running and then obtains information inside the processor. The non-intrusive debugging does not affect normal operations of a data processor and can obtain information inside the processor in real time. It has become a basic requirement for multi-core processor debug modules to support intrusive debug and non-intrusive debug functions. At present, the mainstream multi-core processor debug scheme is the CORESIGHT debug architecture provided by ARM.

SUMMARY OF THE DISCLOSURE

The multi-core processor provided in the present disclosure can realize rapid configuration and control of debug event signal transmission, and at the same time lower power consumption of a debug circuitry.

The present disclosure provides a multi-core processor, comprising a plurality of cores and a debug circuitry. The cores are configured to complete instruction execution and data processing and to output instruction execution information. The debug circuitry comprising debug circuits in the same number as that of the cores, transmission controllers in the same number as that of the cores, and a master control circuit, each of the debug circuits being connected to one core and one transmission controller, respectively, and all transmission controllers being connected to the master control circuit.

DETAILED DESCRIPTION

To make the objectives, technical solutions, and advantages of embodiments of the present disclosure clearer, the technical solutions in the embodiments of the present disclosure are described below with reference to the accompanying drawings. Apparently, the described embodiments are merely some, rather than all, of the embodiments of the present disclosure. Based on the embodiments of the present disclosure, all other embodiments obtainable by a person skilled in the art without creative efforts shall fall within the protective scope of the present disclosure.

Conventional systems provide intrusive debug and non-intrusive debug functions. Some conventional systems consist of a Debug Access Port and a Debug Component. The Debug Access Port provides a mechanism for an external JTAG (Joint Test Action Group) port to access an internal debug component. The debug component comprises a debug register component and a debug event signal transmission control component, wherein the debug register component is used to configure debug conditions and the debug event signal transmission control component is used to control transmission of a debug event signal among multiple cores. The debug event signal transmission control component comprises a Cross Trigger Interface and a Cross Trigger Matrix. The control of debug event signal transmission is achieved by configuring the Cross Trigger Interface.

To achieve synchronous transmission of debug event signals, conventional multi-core processor debug scheme often requires configuration of multiple registers, which increases power consumption of the debug module and also affects the debug efficiency. The present disclosure overcomes these issues by providing a debug event signal transmission solution having low power consumption and high efficiency, which can realize rapid configuration and control of debug event signal transmission and lower power consumption of the debug module.

Figure 1:
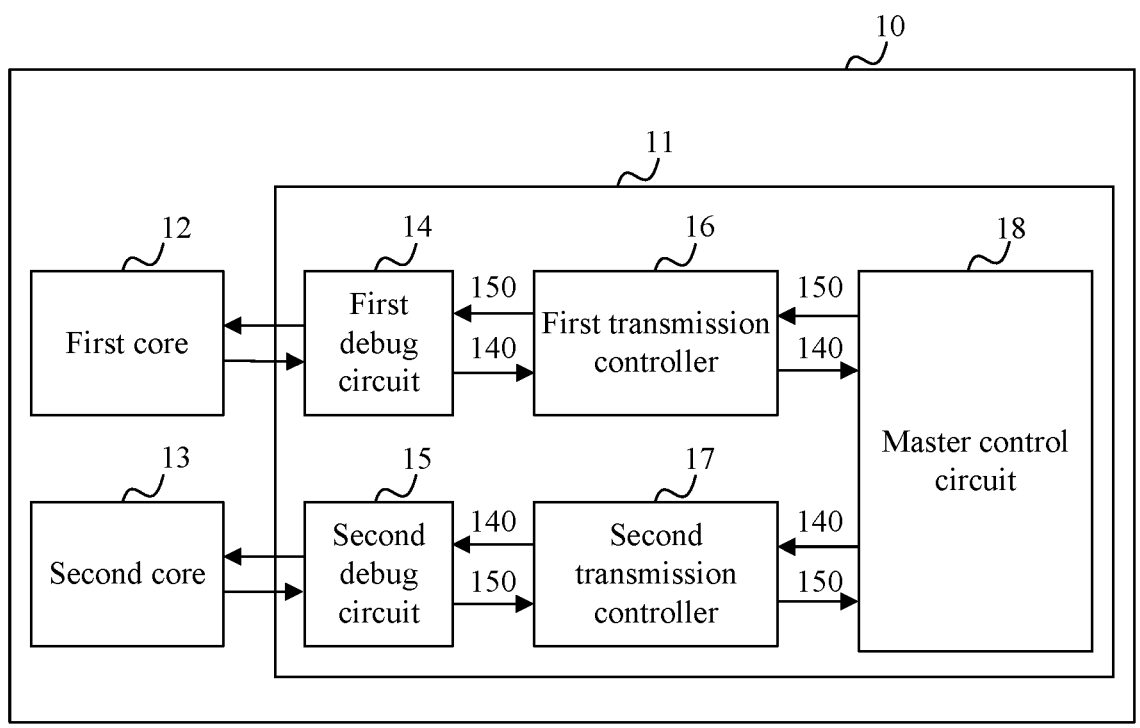
FIG. 1 is a schematic diagram of an exemplary multi-core processor, according to some embodiments of the present disclosure.

Embodiments of the present disclosure provide a multi-core processor. FIG. 1 is a schematic diagram of an overall structure of an exemplary multi-core processor, according to some embodiments of the present disclosure. As shown in FIG. 1, a multi-core processor 10 comprises a first core 12, a second core 13, and a debug circuitry 11.

Debug circuitry 11 comprises a first debug circuit 14, a second debug circuit 15, a first transmission controller 16, a second transmission controller 17, and a master control circuit 18. First debug circuit 14 and second debug circuit 15 are each other's target debug circuit. First debug circuit 14 is connected to first core 12 and first transmission controller 16. Second debug circuit 15 is connected to second core 13 and second transmission controller 17. First transmission controller 16 and second transmission controller 17 are both connected to master control circuit 18.

First core 12 is configured to complete instruction execution and data processing and to transmit instruction execution information to first debug circuit 14.

First debug circuit 14 is configured to generate a first debug event signal 140. In response to first debug event signal 140, first debug circuit 14 is further configured to send an entering debug mode command or an exiting debug mode command to first core 12 according to first debug event signal 140, so as to control first core 12 to enter or exit a debug mode. If first core 12 enters the debug mode, first debug circuit 14 can execute a debug operation for first core 12. First debug circuit 14 is further configured to send, in response to a second debug event signal 150 generated by second debug circuit 15, second debug event signal 150 to first core 12, so as to control first core 12 to enter or exit the debug mode, and to execute a debug operation for first core 12 after first core 12 enters the debug mode. Second debug event signal 150 is transmitted to first debug circuit 14 via second transmission controller 17, master control circuit 18, and first transmission controller 16.

Second core 13 is configured to complete instruction execution and data processing and to transmit instruction execution information to second debug circuit 15.

Second debug circuit 15 is configured to generate second debug event signal 150. In response to the second debug event signal 150, second debug circuit 15 is further configured to send an entering debug mode command or an exiting debug mode command to second core 13 according to second debug event signal 150, so as to control second core 13 to enter or exit a debug mode. If second core 13 enters the debug mode, second debug circuit 15 can execute a debug operation for second core 13. Second debug circuit 15 is further configured to send, in response to first debug event signal 140 generated by first debug circuit 14, first debug event signal 140 to second core 13, so as to control second core 13 to enter or exit the debug mode, and to execute a debug operation for second core 13 after second core 13 enters the debug mode. First debug event signal 140 is transmitted to second debug circuit 15 via first transmission controller 16, master control circuit 18, and second transmission controller 17.

First transmission controller 16 is configured to control transmission of first debug event signal 140 and/or second debug event signal 150 between first debug circuit 14 and master control circuit 18.

Second transmission controller 17 is configured to control transmission of first debug event signal 140 and/or second debug event signal 150 between second debug circuit 15 and master control circuit 18.

Master control circuit 18 is configured to forward first debug event signal 140 and/or second debug event signal 150 between first transmission controller 16 and second transmission controller 17.

The phrase "in response to a debug event signal" in the embodiments of the present disclosure refers to sending an entering debug mode command or an exiting debug mode command to a core according to the debug event signal, so as to control the core to enter or exit a debug mode.

In some embodiments, debug event signals (e.g., first debug signal 140 or second debug signal 150) generated by the debug circuits (e.g., first debug circuit 14 or second debug circuit 15) in the embodiments of the present disclosure can have two transmission modes: the debug event signals are transmitted as binary logic signals or pulse signals. The debug circuits have slightly different structures for the two signal transmission modes, which are explained below through examples.

Figure 2:
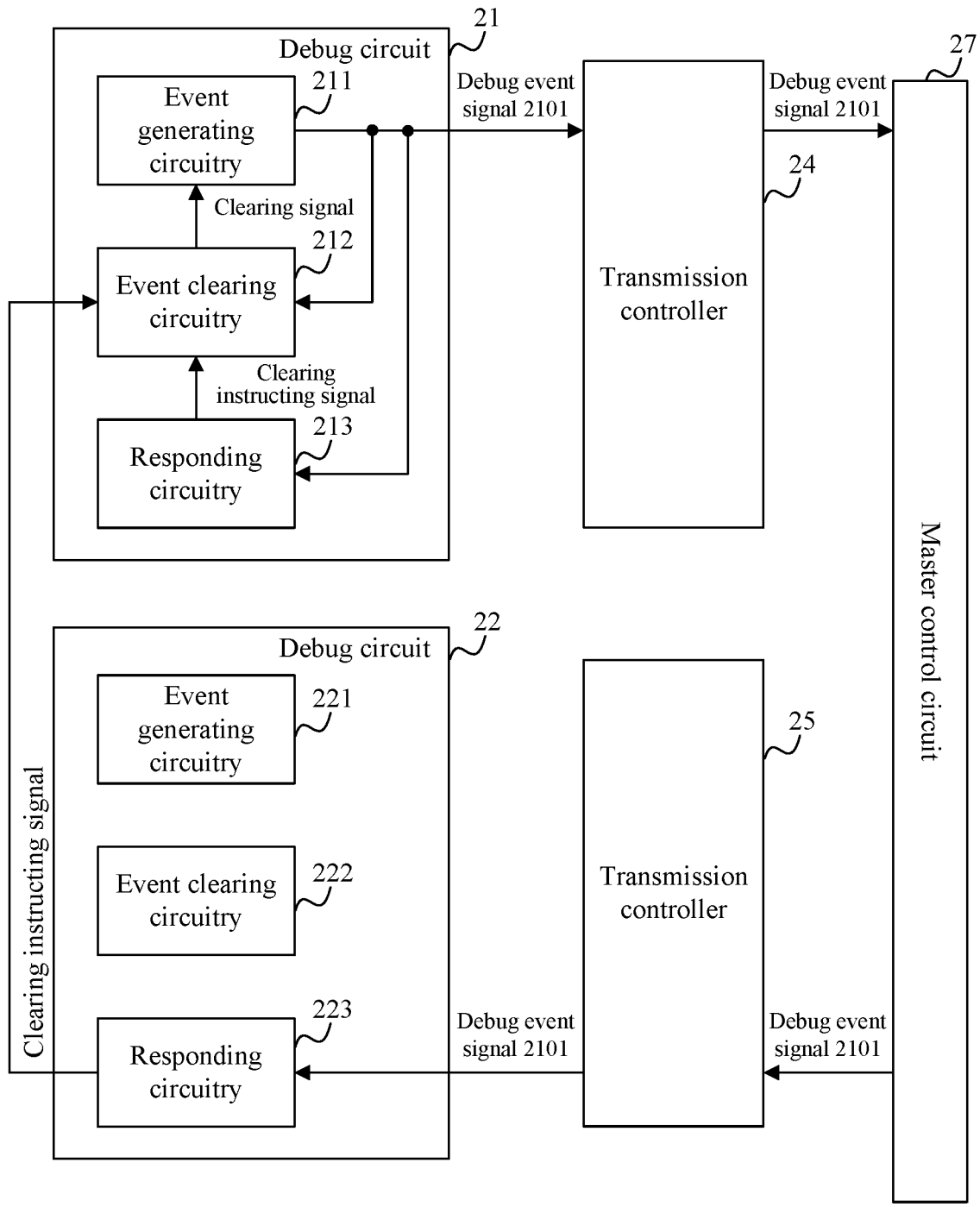
FIG. 2 is a schematic diagram of an exemplary debug circuitry of the multi-core processor, according to some embodiments of the present disclosure.

FIG. 2 is a schematic diagram of an exemplary debug circuitry of the multi-core processor, according to some embodiments of the present disclosure. When debug event signals are transmitted as high-level signals, the debug event signals generated by a debug circuit may need to be cleared, and the structure of the debug circuitry is shown in FIG. 2.

Debug circuit 21 comprises an event generating circuitry 211, an event clearing circuitry 212, and a responding circuitry 213. Debug circuit 22 comprises an event generating circuitry 221, an event clearing circuitry 222, and a responding circuitry 223. Each debug circuit has a mutually independent event clearing circuitry, and each event clearing circuitry is enabled by a debug event signal (e.g., debug event signal 2101 of FIG. 2) from a debug circuit to which the event clearing circuitry belongs. In other words, an event clearing circuitry is enabled only when a debug event signal is generated.

Event generating circuitry 211 is configured to generate a debug event signal 2101, and debug event signal 2101 is transmitted as a high-level signal. Debug event signal 2101 directly enters responding circuitry 213. At the same time, debug event signal 2101 is transmitted to responding circuitry 223 via a transmission controller 24, a master control circuit 27, and a transmission controller 25.

Responding circuitry 213 and responding circuitry 223 are respectively configured to control, in response to input debug event signal 2101, the connected cores (the cores are not shown in the figure; see first core 12 and second core 13 of FIG. 1 as examples) to enter or exit the debug mode, and to execute a debug operation for the connected cores after the connected cores enter the debug mode. Responding circuitries 213 and 223 are also configured to respectively send, after respectively responding to debug event signal 2101, a clearing instructing signal to event clearing circuitry 212.

Event clearing circuitry 212 is configured to send, upon receiving a clearing instructing signal sent from responding circuitry 213 and responding circuitry 223, a clearing signal to event generating circuitry 211 to clear debug event signal 2101 (e.g., set debug event signal 2101 to low level).

Figure 3:
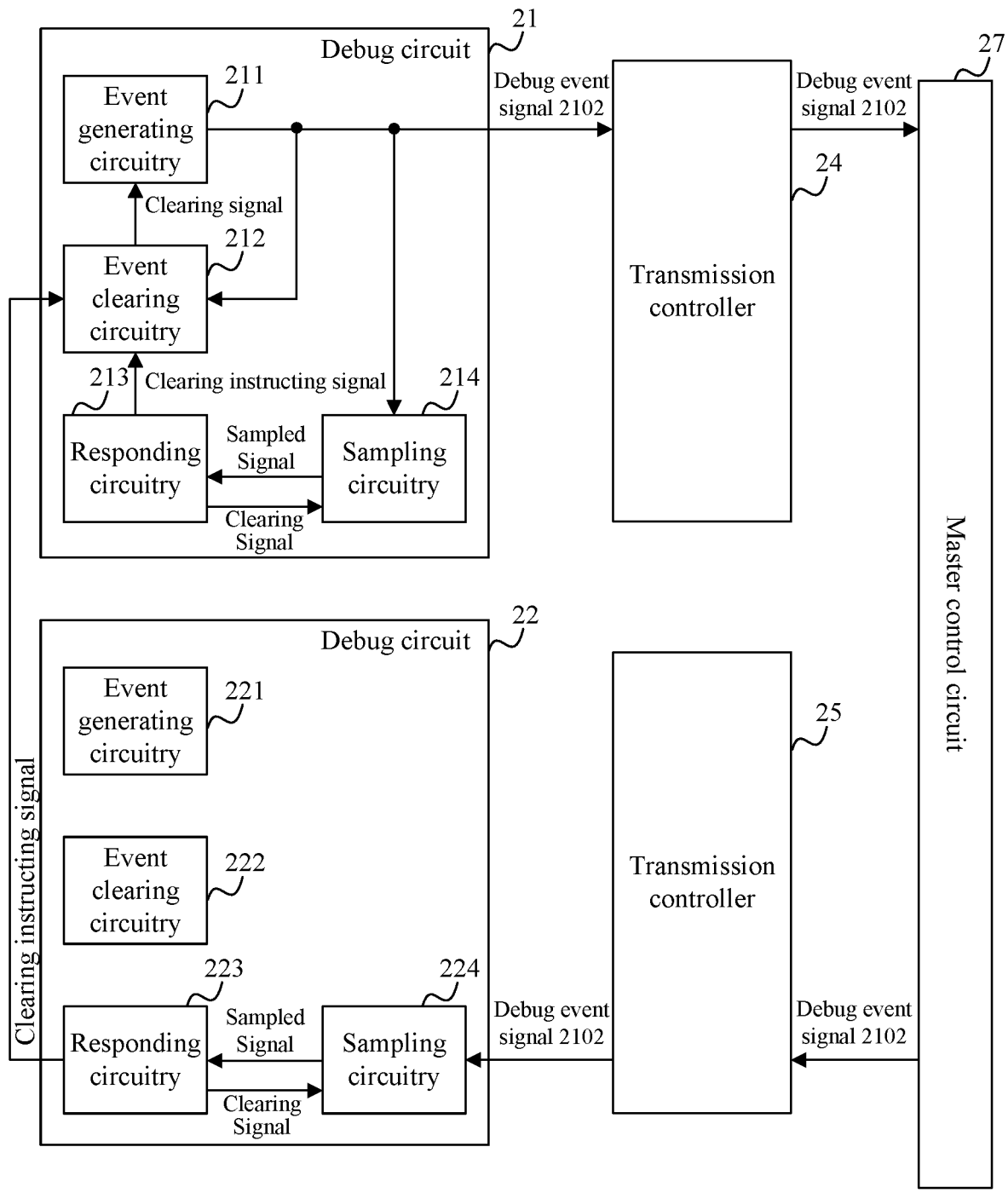
FIG. 3 is a schematic diagram of another exemplary debug circuitry of the multi-core processor, according to some embodiments of the present disclosure.

In another example, debug event signals are transmitted as pulse signals. Each debug circuit further needs a sampling circuitry to prevent loss of debug event signals. Similarly, the sampling circuitry requires clearing. FIG. 3 is a schematic diagram of another exemplary debug circuitry of the multi-core processor, according to some embodiments of the present disclosure. On the basis of FIG. 2, debug circuit 21 further comprises a sampling circuitry 214, and debug circuit 22 further comprises a sampling circuitry 224.

Event generating circuitry 211 is configured to generate a debug event signal 2102, and debug event signal 2102 is transmitted in the form of a pulse signal. Debug event signal 2102 directly enters sampling circuitry 214. At the same time, debug event signal 2102 is transmitted to sampling circuitry 224 via transmission controller 24, master control circuit 27, and transmission controller 25.

Sampling circuitry 214 and sampling circuitry 224 are respectively configured to sample input pulse debug event signal 2102 and output a high-level sampled signal.

Responding circuitry 213 and 223 are respectively configured to receive the high-level sampled signal output by the connected sampling circuitries. Responding circuitry 213 and responding circuitry 223 are further configured to control, in response to the high-level sampled signals corresponding to debug event signal 2102, the connected cores to enter or exit the debug mode, and to execute a debug operation for the connected cores after the connected cores enter the debug mode. Responding circuitry 213 and responding circuitry 223 are further configured to send, after responding to the high-level sampled signals corresponding to debug event signal 2102, a clearing signal to the connected sampling circuitries to clear the sampling circuitries, and a clearing instructing signal to event clearing circuitry 212.

Event clearing circuitry 212 is configured to send, upon receiving a clearing instructing signal sent from responding circuitry 213 and responding circuitry 223, a clearing signal to event generating circuitry 211 to clear debug event signal 2102.

The examples above use two debug circuits. In a system where there are three debug circuits, The structure of the debug circuitry in the case of transmission as binary logic signals is shown in FIG. 4, and the structure of the debug circuitry in the case of transmission as pulse signals is shown in FIG. 5.

Figure 4:
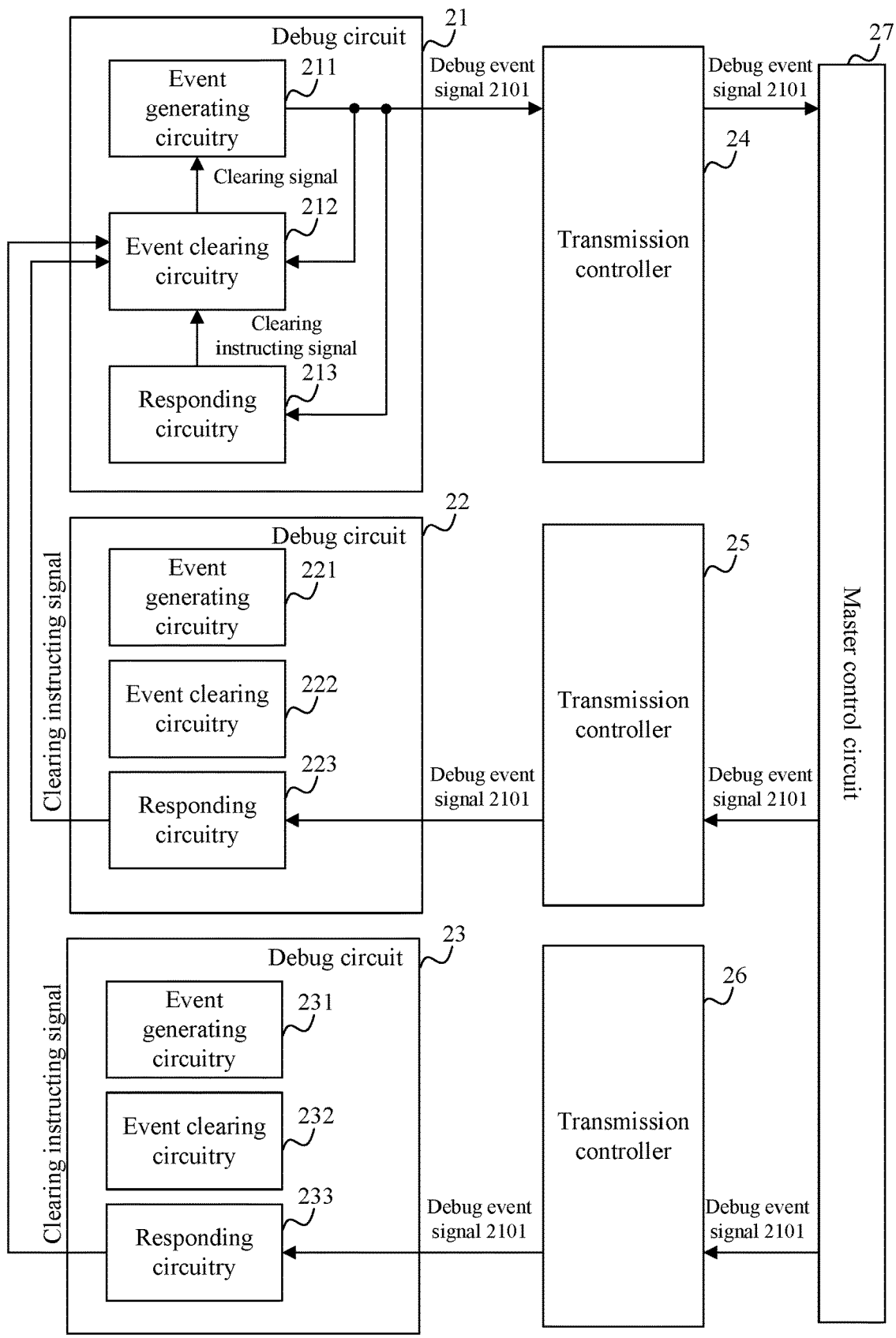
FIG. 4 is a schematic diagram of another exemplary debug circuitry of the multi-core processor, according to some embodiments the present disclosure.
Figure 5:
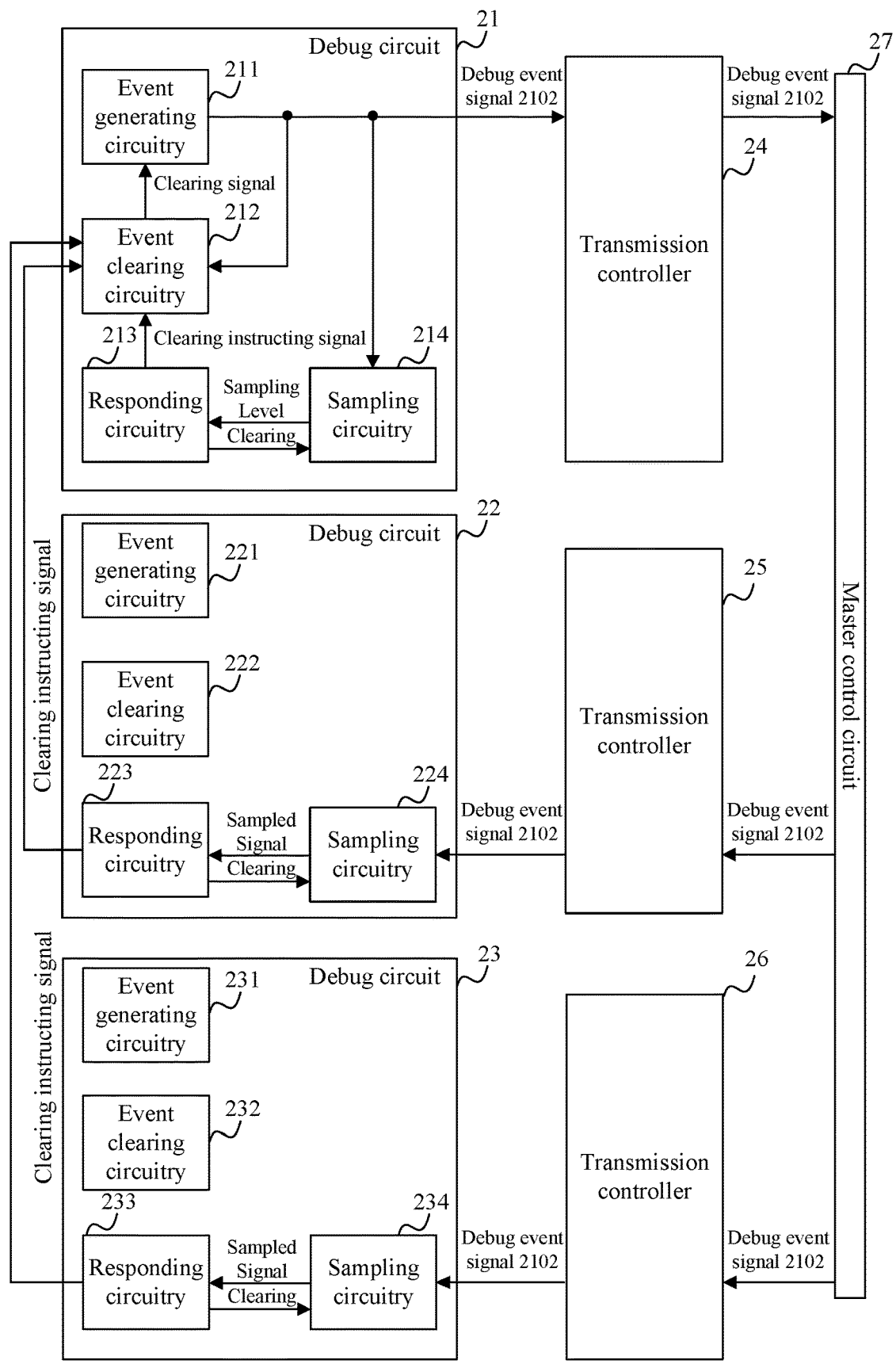
FIG. 5 is a schematic diagram of another exemplary debug circuitry of the multi-core processor, according to some embodiments of the present disclosure.

FIG. 4 is a schematic diagram of another exemplary debug circuitry of the multi-core processor, according to some embodiments the present disclosure. As shown in FIG. 4, debug circuit 21 comprises an event generating circuitry 211, an event clearing circuitry 212, and a responding circuitry 213. Debug circuit 22 comprises an event generating circuitry 221, an event clearing circuitry 222, and a responding circuitry 223. Debug circuit 23 comprises an event generating circuitry 231, an event clearing circuitry 232, and a responding circuitry 233.

Event generating circuitry 211 is configured to generate a debug event signal 2101, and debug event signal 2101 is transmitted as a high-level signal. Debug event signal 2101 directly enters responding circuitry 213. At the same time, debug event signal 2101 is transmitted to responding circuitry 223 via transmission controller 24, master control circuit 27, and transmission controller 25, and to responding circuitry 233 via transmission controller 26.

Responding circuitries 213, 223, and 233 are respectively configured to control, in response to input debug event signal 2101, the connected cores (the cores are not shown in the figure; see first core 12 and second core 13 of FIG. 1 as examples) to enter or exit the debug mode, and to execute a debug operation for the connected cores after the connected cores enter the debug mode. Responding circuitries 213, 223, and 233 respectively send, after respectively responding to debug event signal 2101, a clearing instructing signal to event clearing circuitry 212.

Event clearing circuitry 212 is configured to send, upon receiving a clearing instructing signal sent from responding circuitries 213, 223, and 233, a clearing signal to connected event generating circuitry 211 to clear debug event signal 2101.

FIG. 5 is a schematic diagram of another exemplary debug circuitry of the multi-core processor, according to some embodiments of the present disclosure. As shown in FIG. 5, on the basis of FIG. 4, debug circuit 21 further comprises a sampling circuitry 214. Debug circuit 22 further comprises a sampling circuitry 224. Debug circuit 23 further comprises a sampling circuitry 234.

Event generating circuitry 211 is configured to generate a debug event signal 2102, and debug event signal 2102 is transmitted in the form of a pulse signal. Debug event signal 2102 directly enters sampling circuitry 214. At the same time, debug event signal 2102 is transmitted to sampling circuitry 224 via transmission controller 24, master control circuit 27, and transmission controller 25, and to sampling circuitry 234 via transmission controller 26.

Sampling circuitries 214, 224, and 234 are respectively configured to sample debug event signal 2102 and output a high-level sampled signal.

Responding circuitries 213, 223, and 233 are respectively configured to receive the high-level sampled signal output by the connected sampling circuitries. In response to the high-level sampled signals corresponding to debug event signal 2102, Responding circuitries 213, 223, and 233 are further configured to control the respectively connected cores to enter or exit the debug mode, and to execute a debug operation for the respectively connected cores after the cores enter the debug mode. Responding circuitries 213, 223, and 233 are further configured to send, after responding to the high-level sampled signals corresponding to debug event signal 2102, a clearing signal to the connected sampling circuitries to clear the sampling circuitries, and a clearing instructing signal to the event clearing circuitry 212.

Event clearing circuitries 212, 222 and 232 is configured to send, upon receiving the clearing instructing signal sent from responding circuitries 213, 223, and 233, a clearing signal to event generating circuitry 211, 221 and 231 to clear debug event signal 2102.

Referring back to FIG. 1, it can be seen from the above description that the multi-core processor according to the embodiments of the present disclosure configures first debug circuit 14 to generate first debug event signal 140. First debug event signal 140 is transmitted in the form of a high-level signal or a pulse signal to enable first transmission controller 16, such that first transmission controller 16 allows transmission of first debug event signal 140 to master control circuit 18. Master control circuit 18 receives first debug event signal 140 transmitted from first transmission controller 16, and forwards first debug event signal 140 to second transmission controller 17 to enable second transmission controller 17, such that second transmission controller 17 allows receipt of first debug event signal 140. Second debug circuit 15 responds to first debug event signal 140, and then clears first debug event signal 140. Compared with the conventional systems, the multi-core processor according to the embodiments of the present disclosure has a structure that can realize rapid configuration and control of debug event signal transmission, and at the same time lower power consumption of a debug circuitry.

Furthermore, in some embodiments, the debug event signal generated by each event generating circuitry comprises an entering debug mode event signal and an exiting debug mode event signal.

Figure 6:
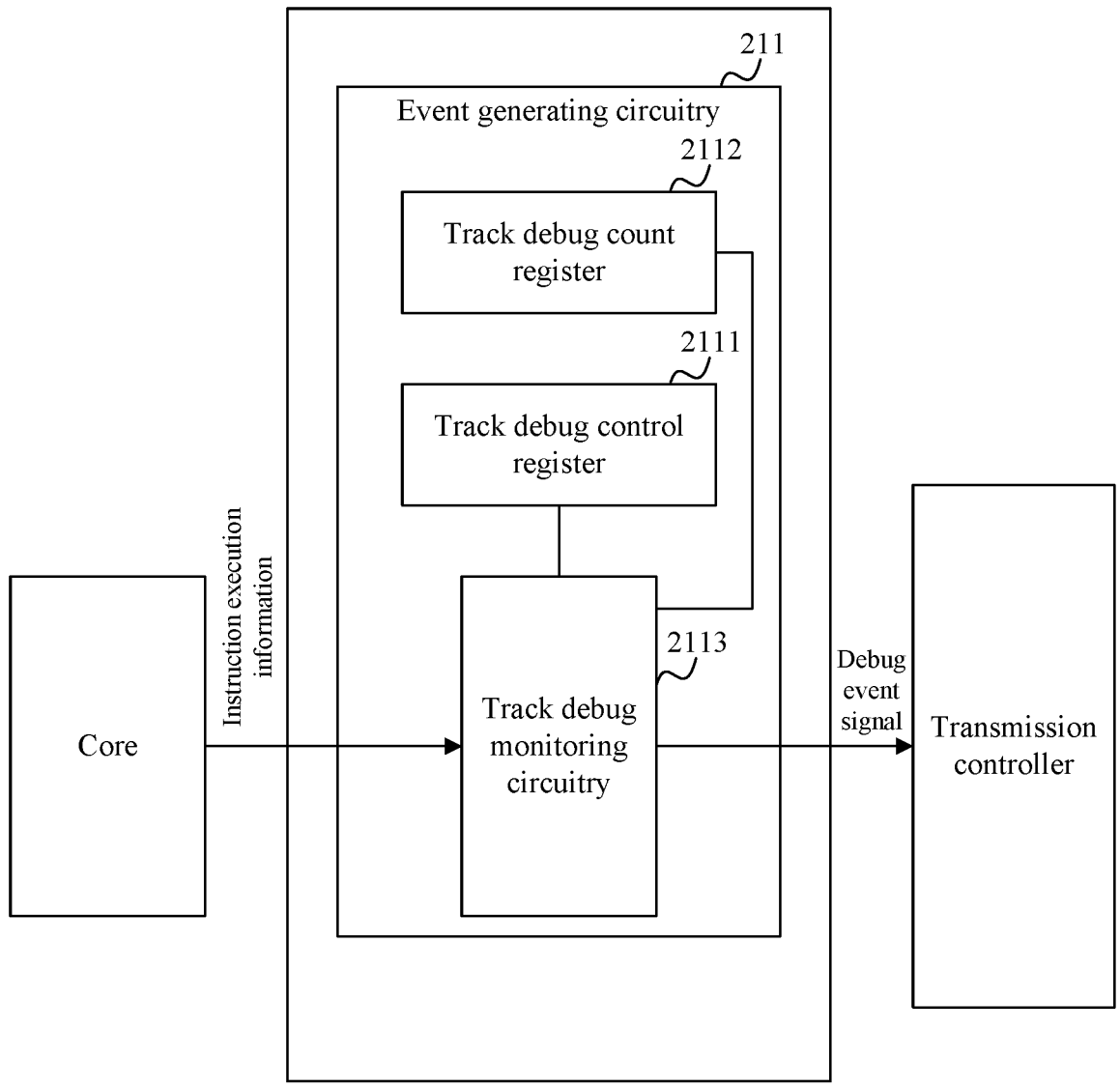
FIG. 6 is a schematic diagram of an exemplary event generating circuitry implementing debug conditions, according to some embodiments of the present disclosure.

Two methods are provided for configuring the event generating circuitry to generate the entering debug mode event signal. The first method is to directly configure the event generating circuitry to generate the entering debug mode event signal. The second method is to configure debug conditions to be met by the core connected to the event generating circuitry, and when the core meets the debug conditions, the event generating circuitry generates the entering debug mode event signal. FIG. 6 is a schematic diagram of an exemplary event generating circuitry implementing debug conditions, according to some embodiments of the present disclosure. According to FIG. 6, event generating circuitry 211 comprises a track debug control register 2111, a track debug count register 2112, and a track debug monitoring circuitry 2113. Track debug control register 2111 is configured to enable track debug monitoring circuitry 2113. Track debug count register 2112 is configured to set the number of instructions to be executed by the core to enter the debug mode. Track debug monitoring circuitry 2113 is configured to monitor the number of instructions executed by the core, and when the number of executed instructions is equal to the number set in the track debug count register 2112, track debug monitoring circuitry 2113 generates the entering debug mode event signal.

Event generating circuitry 211 is directly configured to generate the exiting debug mode event signal.

Figure 7:
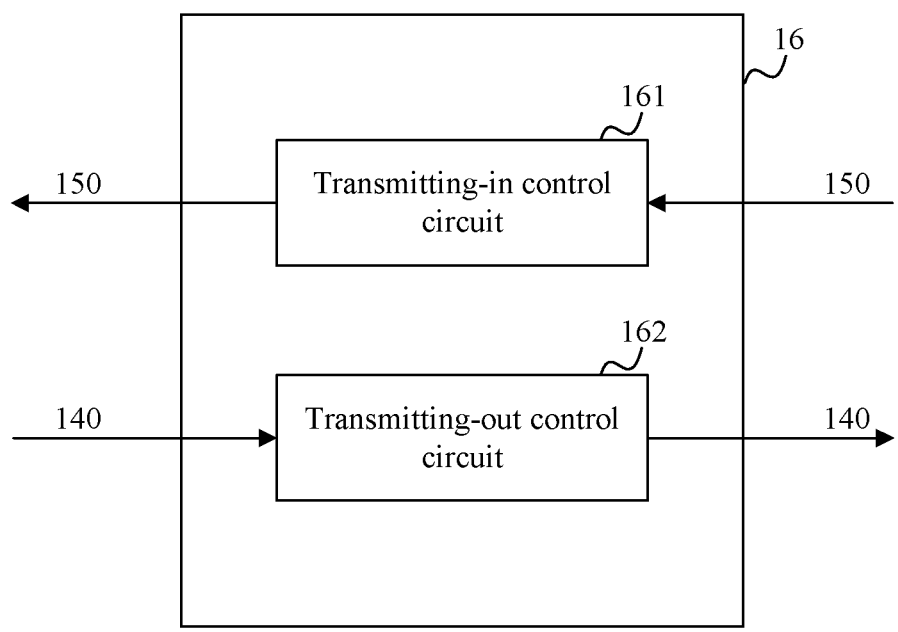
FIG. 7 is a schematic diagram of an exemplary transmission controller, according to some embodiments of the present disclosure.

Furthermore, in some embodiments, each transmission controller comprises a transmitting-in control circuit and a transmitting-out control circuit that are mutually independent. FIG. 7 is a schematic diagram of an exemplary transmission controller, according to some embodiments of the present disclosure. According to FIG. 7, first transmission controller 16 comprises a transmitting-in control circuit 161 and a transmitting-out control circuit 162. Transmitting-in control circuit 161 is configured to disallow or allow receiving debug event signals generated by other debug circuits forwarded by the master control circuit. Transmitting-out control circuit 162 is configured to disallow or allow transmitting, to the master control circuit, a debug event signal generated by a debug circuit connected to the transmission controller.

In combination with FIG. 1, when first transmission controller 16 receives first debug event signal 140 transmitted from first debug circuit 14, first transmission controller 16 disallows transmitting first debug event signal 140 to master control circuit 18 if transmitting-out control circuit 162 is configured to be closed, and as a result first debug event signal 140 cannot be transmitted to the master control circuit 18. If transmitting-out control circuit 162 is configured to be open, first transmission controller 16 allows transmitting first debug event signal 140 to master control circuit 18, and first debug event signal 140 is transmitted to master control circuit 18.

When first transmission controller 16 is to receive second debug event signal 150 transmitted from master control circuit 18, first transmission controller 16 disallows receiving second debug event signal 150 if transmitting-in control circuit 161 is configured to be closed, and as a result second debug event signal 150 cannot be transmitted to first debug circuit 14. If transmitting-in control circuit 161 is configured to be enabled, first transmission controller 16 allows receiving second debug event signal 150, and second debug event signal 150 is transmitted to first debug circuit 14.

It is appreciated that first transmission controller 16 controls transmission or receipt of a debug event signal on the side of master control circuit 18 and does not perform control on the side of first debug circuit 14.

Furthermore, master control circuit 18 comprises a connection matrix circuit configured to receive a debug event signal from each transmission controller and to send the received debug event signal to all other transmission controllers.

Some embodiments of the present disclosure are described above, but the protective scope of the present disclosure is not limited to these embodiments. Any variation or substitution that can be easily conceived of by a person skilled in the art within the technical scope disclosed by the present disclosure shall fall within the protective scope of the present disclosure. Therefore, the protective scope of the present disclosure should be subjected to the protective scope of the claims.

The invention claimed is:

1. A multi-core processor, comprising:
a plurality of cores configured to complete instruction execution and data processing and to output instruction execution information; and
debug circuitry separate from the plurality of cores, the debug circuitry comprising:
a plurality of debug circuits that are each coupled to a corresponding core of the plurality of cores and configured to:
acquire a debug event signal;
control, in response to the acquired debug event signal, the corresponding core to enter a debug mode; and
execute a debug operation for the corresponding core after the corresponding core enters the debug mode;
a master control circuit, and
a plurality of transmission controllers that are each coupled to a corresponding debug circuit of the plurality of debug circuits and to the master control circuit and configured to control transmission of the debug event signal between the corresponding debug circuit and the master control circuit, wherein the master control circuit is configured to receive and forward debug event signals among different transmission controllers,
wherein the plurality of transmission controller each comprises a transmitting-in control circuit and a transmitting-out control circuit, wherein
the transmitting-in control circuit of a transmission controller is configured to disallow or allow receiving debug event signals generated by other debug circuits forwarded by the master control circuit; and
the transmitting-out control circuit of the transmission controller is configured to disallow or allow transmitting, to the master control circuit, a debug event signal generated by a debug circuit coupled to the transmission controller.

2. The multi-core processor of claim 1, wherein the debug event signal is acquired in response to a debug circuit of the plurality of debug circuits generating the debug event signal or receiving the debug event signal generated by another debug circuit of the plurality of debug circuits.

3. The multi-core processor of claim 2, wherein the generated debug event signal is transmitted to a target debug circuit of the plurality of debug circuits via a first transmission controller coupled to the debug circuit, the master control circuit, and a second transmission controller communicatively coupled to the target debug circuit, wherein the plurality of transmission controllers includes the first and second transmission controllers.

4. The multi-core processor according to claim 2, wherein the plurality of debug circuits each comprise an event generating circuit, a responding circuit, and an event clearing circuit, wherein
An event generating circuit of the debug circuit is configured to generate and send the debug event signal to a responding circuit of the debug circuit and to a responding circuit of the target debug circuit in the form of a binary logic signal;
the responding circuit of the debug circuit is configured to:
control, in response to the debug event signal generated by the debug circuit, a core coupled to the debug circuit to enter or exit the debug mode, and to execute a debug operation on the core after the core enters the debug mode, and
send, after each time of responding to the debug event signal, a clearing instructing signal to an event clearing circuit of the debug circuit; and
the event clearing circuit of the debug circuit is configured to send, after receiving the clearing instructing signal sent from the responding circuit of the debug circuit and a responding circuit of the target debug circuit, a clearing signal to the event generating circuit coupled to the debug circuit.

5. The multi-core processor of claim 4, wherein the debug event signal sent by the event generating circuit to the responding circuit of the target debug circuit is a high-level binary logic signal.

6. The multi-core processor according to claim 2, wherein the debug circuit comprises an event generating circuit, a sampling circuit, a responding circuit, and an event clearing circuit, wherein
the event generating circuit is configured to generate and send the debug event signal to the responding circuit inside the debug circuit and to a responding circuit of each target debug circuit in the form of a pulse signal;
the sampling circuit is configured to sample the debug event signal and output a high-level sampled signal;
the responding circuit is configured to:
receive the sampled signal output by the sampling circuit, to control, in response to the sampled signal, a core coupled to the debug circuit to enter or exit the debug mode, and to execute a debug operation on the core after the core enters the debug mode, and
send, after each time of responding to the sampled signal, a clearing signal to the sampling circuit and a clearing instructing signal to the event clearing circuit; and
the event clearing circuit is configured to send, upon receiving the clearing instructing signal sent from the responding circuit of the debug circuit and responding circuit of each target debug circuit, a clearing signal to the event generating circuit.

7. The multi-core processor according to claim 6, wherein the debug event signal generated by the event generating circuit comprises an entering debug mode event signal and an exiting debug mode event signal.

8. The multi-core processor according to claim 7, wherein the event generating circuit is configured to generate the entering debug mode event signal.

9. The multi-core processor according to claim 7, wherein the event generating circuit is configured to generate, when the core meets a set of debug conditions, the entering debug mode event signal.

10. The multi-core processor according to claim 9, wherein the event generating circuit comprises: a track debug control register, a track debug count register, and a track debug monitoring circuit, wherein
the track debug control register is configured to enable the track debug monitoring circuit;
the track debug count register is configured to set a limit on the number of instructions to be executed by the core to enter the debug mode; and
the track debug monitoring circuit is configured to monitor the number of instructions executed by the core, and when the number of executed instructions is equal to the limit set in the track debug count register, to generate the entering debug mode event signal.

11. The multi-core processor according to claim 7, wherein the event generating circuit is configured to generate the exiting debug mode event signal.

12. A multi-core processor, comprising:
a plurality of cores configured to complete instruction execution and data processing and to output instruction execution information; and
debug circuitry separate from the plurality of cores, the debug circuitry comprising:
a plurality of debug circuits that are each coupled to a corresponding core of the plurality of cores and configured to:
acquire a debug event signal;
control, in response to the acquired debug event signal, the corresponding core to enter a debug mode; and
execute a debug operation for the corresponding core after the corresponding core enters the debug mode;
a master control circuit, and
a plurality of transmission controllers that are each coupled to a corresponding debug circuit of the plurality of debug circuits and to the master control circuit and configured to control transmission of the debug event signal between the corresponding debug circuit and the master control circuit, wherein the master control circuit is configured to receive and forward debug event signals among different transmission controllers,
wherein the master control circuit comprises a connection matrix circuit configured to receive a debug event signal from a first transmission controller of the plurality of transmission controllers and to send the received debug event signal to a second transmission controller of the plurality of transmission controllers.

13. A debug circuitry, comprising:
a plurality of debug circuits that are each coupled to a corresponding core of a plurality of cores that are separate from the debug circuitry, the plurality of debug circuits configured to:
acquire a debug event signal;
control, in response to the acquired debug signal, the corresponding core to enter a debug mode; and
execute a debug operation for the corresponding core after the corresponding core enters the debug mode;
a master control circuit, and
a plurality of transmission controllers that are each coupled to a corresponding debug circuit of the plurality of debug circuits and to the master control circuit and configured to control transmission of the debug event signal between the corresponding debug circuit and the master control circuit, wherein the master control circuit is configured to receive and forward debug event signals among different transmission controllers,
wherein the plurality of transmission controller each comprises a transmitting-in control circuit and a transmitting-out control circuit, wherein
the transmitting-in control circuit of a transmission controller is configured to disallow or allow receiving debug event signals generated by other debug circuits forwarded by the master control circuit; and
the transmitting-out control circuit of the transmission controller is configured to disallow or allow transmitting, to the master control circuit, a debug event signal generated by a debug circuit coupled to the transmission controller.

14. The debug circuitry of claim 13, wherein the debug event signal is acquired in response to a debug circuit of the plurality of debug circuits generating the debug event signal or receiving the debug event signal generated by another debug circuit of the plurality of debug circuits.

15. The debug circuitry of claim 14, wherein the generated debug event signal is transmitted to a target debug circuit of the plurality of debug circuits via a first transmission controller coupled to the debug circuit, the master control circuit, and a second transmission controller communicatively coupled to the target debug circuit, wherein the plurality of transmission controllers includes the first and second transmission controllers.

16. The debug circuitry according to claim 14, wherein the plurality of debug circuits each comprise an event generating circuit, a responding circuit, and an event clearing circuit, wherein an event generating circuit of the debug circuit is configured to generate and send the debug event signal to a responding circuit of the debug circuit and to a responding circuit of the target debug circuit in the form of a binary logic signal;

the responding circuit of the debug circuit is configured to:

control, in response to the debug event signal generated by the debug circuit, a core coupled to the debug circuit to enter or exit the debug mode, and to execute a debug operation on the core after the core enters the debug mode, and send, after each time of responding to the debug event signal, a clearing instructing signal to an event clearing circuit of the debug circuit; and the event clearing circuit of the debug circuit is configured to send, after receiving the clearing instructing signal sent from the responding circuit of the debug circuit and a responding circuit of the target debug circuit, a clearing signal to the event generating circuit coupled to the debug circuit.

17. The debug circuitry according to claim 14, wherein the debug circuit comprises an event generating circuit, a sampling circuit, a responding circuit, and an event clearing circuit, wherein the event generating circuit is configured to generate and send the debug event signal to the responding circuit inside the debug circuit and to a responding circuit of each target debug circuit in the form of a pulse signal;

the sampling circuit is configured to sample the debug event signal and output a high-level sampled signal;

the responding circuit is configured to:

receive the sampled signal output by the sampling circuit, to control, in response to the sampled signal, a core coupled to the debug circuit to enter or exit the debug mode, and to execute a debug operation on the core after the core enters the debug mode, and send, after each time of responding to the sampled signal, a clearing signal to the sampling circuit and a clearing instructing signal to the event clearing circuit; and the event clearing circuit is configured to send, upon receiving the clearing instructing signal sent from the responding circuit of the debug circuit and responding circuit of each target debug circuit, a clearing signal to the event generating circuit.

18. The debug circuitry according to claim 13, wherein the master control circuit comprises a connection matrix circuit configured to receive a debug event signal from transmission controller of the plurality of transmission controllers and to send the received debug event signal to other transmission controllers of the plurality of transmission controllers.

* * * * *

UNITED STATES PATENT AND TRADEMARK OFFICE
CERTIFICATE OF CORRECTION

PATENT NO. : 11,215,665 B2
APPLICATION NO. : 16/638730
DATED : January 4, 2022
INVENTOR(S) : Taotao Zhu et al.

It is certified that error appears in the above-identified patent and that said Letters Patent is hereby corrected as shown below:

In the Claims

In Claim 1, Column 8, Line 14, "plurality of transmission controller" should read --plurality of transmission controllers--.

In Claim 4, Column 8, Lines 42-43, "wherein An event generating circuit" should read --wherein an event generating circuit--.

In Claim 13, Column 10, Line 42, "plurality of transmission controller" should read --plurality of transmission controllers--.

Signed and Sealed this
Seventeenth Day of October, 2023

Katherine Kelly Vidal
*Director of the United States Patent and Trademark Office*